United States Patent [19]

Chanteau

[11] Patent Number: 5,336,113
[45] Date of Patent: Aug. 9, 1994

[54] CONNECTION DEVICE

[75] Inventor: Pierre Chanteau, La Haye Malherbe, France

[73] Assignee: U.S. Philips Corporation, New York, N.Y.

[21] Appl. No.: 46,821

[22] Filed: Apr. 13, 1993

[30] Foreign Application Priority Data

Apr. 15, 1992 [FR] France .................. 92 04615

[51] Int. Cl.[5] ................................ H01R 17/04
[52] U.S. Cl. .................... 439/581; 439/63; 439/778
[58] Field of Search .............. 439/394, 811, 78, 63, 439/578–585, 797, 798, 785, 801, 778

[56] References Cited

U.S. PATENT DOCUMENTS

| 3,209,202 | 9/1965 | Mueller ................. 439/78 |
| 3,413,591 | 11/1968 | Hergenhan ............. 439/78 |
| 3,523,268 | 8/1970 | Foster ................... 439/78 |
| 4,616,896 | 10/1986 | Martin et al. ........... 439/78 |

FOREIGN PATENT DOCUMENTS 1243749  7/1967  Fed. Rep. of Germany ........ 439/78
1264411  5/1961  France .

Primary Examiner—David L. Pirlot
Attorney, Agent, or Firm—William L. Botjer

[57] ABSTRACT

A device for electrical connection of a cable provided with an electrically conductive core to a printed circuit secured in a case, using a tubular member which is longitudinally subdivided into several limbs wherebetween the conductive core of the cable passes, which tubular member is provided with a thread so as to screw thereon a threaded cap provided with a stud-like member which bears on the conductive core of the cable. In accordance with the invention, the printed circuit is provided with orifices to allow passage of the limbs of the tubular member, said orifices forming between themselves a bridge which extends between the limbs of the tubular member and on which there is provided at least one conductive track onto which said stud-like member presses the core of the cable.

5 Claims, 1 Drawing Sheet

CONNECTION DEVICE

BACKGROUND OF THE INVENTION

The invention relates to a device for fastening a cable comprising an electrically conductive core and for electrically connecting said core to another conductor by means of a tubular member which is secured in a case, said tubular member being longitudinally subdivided into a plurality of limbs wherebetween the conductive core of the cable passes and being provided with a thread for screwing on a threaded cap provided with a stud-like member which bears on the conductive core of the cable.

A device of this kind is known from French Patent No. 1,264,411. In the prior art, it is used in the field of electrical construction, for example in junction boxes of domestic electric installations.

SUMMARY OF THE INVENTION

It is an object of the invention to provide a device which, in the field of electronic equipment for notably reception and distribution of television, enables the connection and fastening of a cable to a printed circuit without it being necessary to extend the manufacturing process of said printed circuit with an additional step, such as the fastening of pieces by screwing onto the circuit or by soldering by hand after passage of the circuit through the solder wave.

To this end, in the device in accordance with the invention said other conductor is a conductive track of a printed circuit consisting of conductive tracks on an insulating substrate, which substrate is provided with a plurality of orifices to allow passage of the limbs of the tubular member, said orifices forming between themselves, a bridge which extends between the limbs of the tubular member and on which there is provided at least one conductive track on which said stud-like member bears.

The invention is thus based on the idea to provide the printed circuit with orifices wherebetween a conductor passes so that it can be clamped in a prior-an connection terminal.

Using this means, not only the cable is economically fastened to the printed circuit, but the printed circuit itself is also secured to the case at the same time.

The tubular member is preferably made of an insulating material and the case is either metallic or metallized.

The case thus provides electromagnetic shielding and the body of the connection terminal still does not short-circuit the conductor to ground.

In a particular embodiment, a means for retaining the printed circuit is connected to the tubular member.

Thus, the printed circuit can be secured to the case without special facilities being provided for this purpose.

In an alternative embodiment, the case comprises a wall which is situated in the prolongation of said bridge and which is pierced by a duct for passage of the electric connection cable and by a threaded hole which opens into said duct and in which a screw is screwed in order to clamp the cable, the case being made of metal or being metallized after the formation of the duct.

Said tubular member being formed by moulding, the device advantageously comprises a plurality of said tubular members which are formed as a plurality of members interconnected by an element moulded simultaneously with the members, the members thus being retained relative to one another in positions corresponding to their positions on the printed circuit.

The mounting of the plurality of terminals is thus facilitated, without the cost of the actual terminals being significantly increased.

BRIEF DESCRIPTION OF THE DRAWING

These and other aspects of the invention will be described in detail hereinafter.

DETAILED DESCRIPTION OF THE PREFERRED EMBODIMENT

Figure 1:
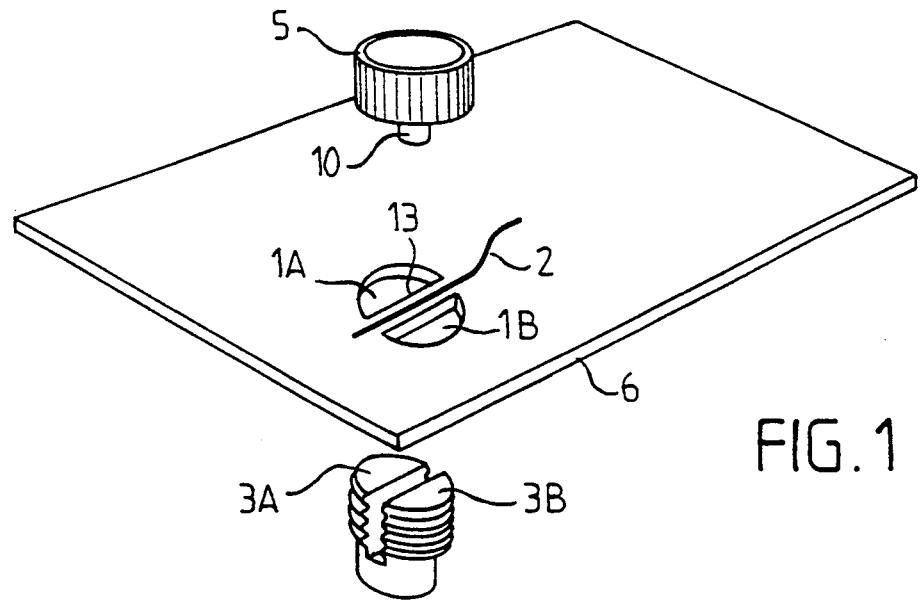
FIG. 1 is a perspective and partly exploded view of a device in accordance with the invention, the case having been omitted so as to show the elements accommodated within the case.
Figure 2:
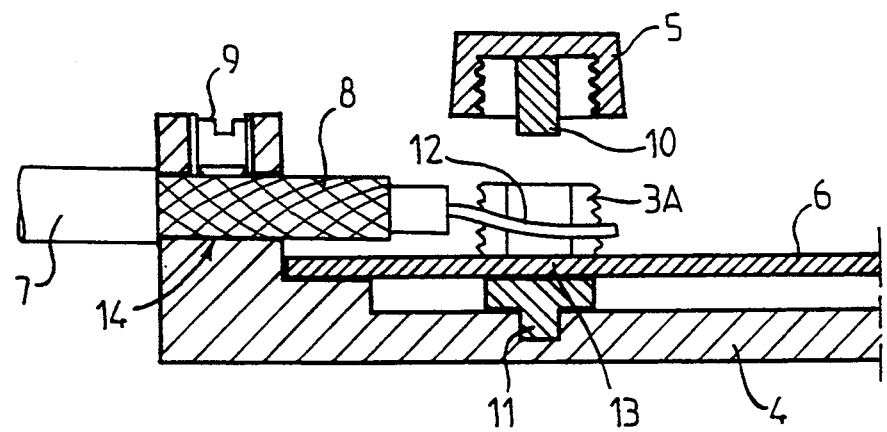
FIG. 2 is a sectional view of a part of a device in accordance with the invention.

The device shown in the FIGS. 1 and 2 is, for example a device which is referred to in practice as a distribution box or a splitter, an amplifier or a coupler, or in other words one of the various devices suitable for use in a television distribution system. It comprises essentially a case which serves to provide mechanical protection and shielding against electromagnetic radiation, said case accommodating a printed circuit which consists of conductive tracks on an insulating substrate which supports the functional electric circuit of the device.

The device being intended for use in a television distribution system, it must be connected to one or several connection cables which serve to connect the device to another device of similar technology, to an antenna or to a site connector.

For the connection of the conductive core of a shielded cable to a printed circuit 6, FIG. 1 illustrates the use of a tubular member which is longitudinally subdivided into two limbs 3A, 3B and which is provided with an external thread so as to screw thereon a cap 5 whose interior wall is threaded and which is provided with a stud-like members 10 which penetrates between the two limbs 3A and 3B when the cap is screwed on.

The printed circuit board is provided with orifices 1A and 1B wherebetween there exists a bridge 13 on which there is provided at least one printed conductive track 2. The limbs of the tubular member 3A and 3B of the connection terminal pass through the orifices 1A and 1B, respectively, of the printed circuit.

FIG. 2 shows how the conductive core 12 of the cable is introduced into the tubular member, between the pans 3A and 3B above the bridge 13 and the stud-like member 10 of the cap which, when the latter is screwed on, presses the core 12 of the cable onto the bridge 13 situated between the limbs of the tubular member. The tubular member is made of an insulating material and the case is metallic or metallized. The tubular member is manufactured, for example by moulding using a thermoforming plastic material. The tubular member is secured in the case 4 by means of, for example a projection 11 which is provided at the lower pan of the member and which is clamped in the bottom of the case.

For fastening and electrical connection of the shielding 8 of the cable 7, to ground, the wall of the case situated in the prolongation of the bridge, that is to say the wall at the left in FIG. 2, is pierced by a duct 14 for the passage of the cable, and by a threaded hole which opens into said duct 14 and in which a headless screw 9 is screwed so as to clamp the cable. In the case of a metallized case, the case is metallized after the formation of the duct 14 so that the interior of the duct 14 is also metallized. The insulating sheath of the cable is removed over a given length in order to expose the shielding brading or strip 8 to ensure that it contacts the wall of the duct 14 and metallic screw 9.

Evidently, the case 4 must be provided with a lid which, however, has been omitted for the sake of simplicity of the Figure.

A device of this kind generally comprises several connection points for the connection of several cables. For the mounting of corresponding terminals, FIG. 3 shows how the tubular members of these terminals are formed as a plurality of members which are interconnected by an element 17 which is moulded simultaneously with the members, the members thus being retained relative to one another in positions corresponding to the orifices provided in the printed circuit.

Figure 3:
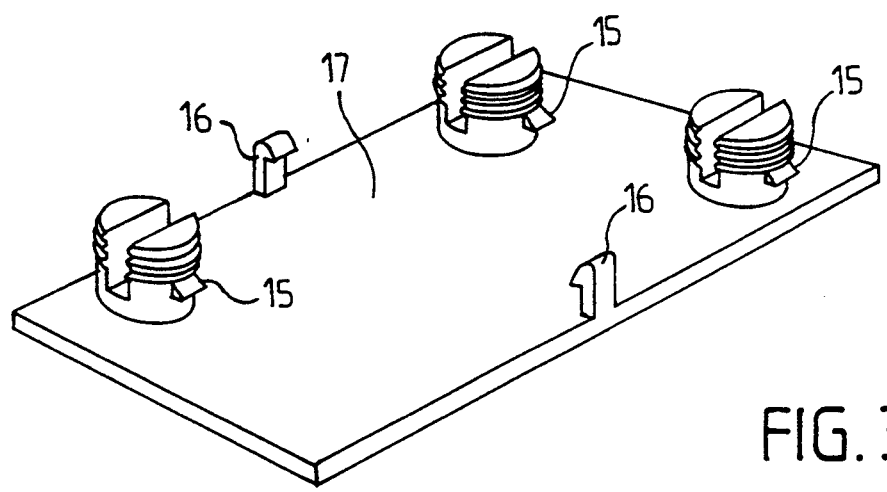
FIG. 3 is a perspective view of a specific embodiment with a plurality of tubular members.

The tubular members shown in FIG. 3 are provided with projections 15 in the form of hooks which enable a printed circuit to be retained in position even before the cap or caps 5 are screwed on. The element 17, moulded simultaneously with the members, may itself also be provided with such means for retaining the printed circuit, for example projections with hooks 16.

Alternative embodiments are also feasible: for example, the member 3 of the terminal may be subdivided into more than two limbs, or the thread of the member may be an internal thread, in which case the stud-like member 10 is threaded instead of the cap 5.

I claim:

1. A device for fastening a cable comprising an electrically conductive core and for electrically connecting said core to another conductor by means of a tubular member which is secured in a case, said tubular member being longitudinally subdivided into a plurality of limbs wherebetween the conductive core of the cable passes and being provided with a thread for screwing on a threaded cap provided with a stud-like member which bears on the conductive core of the cable, characterized in that said an other conductor is a conductive track of a printed circuit consisting of conductive tracks on an insulating substrate, which substrate is provided with a plurality of orifices to allow passage of the limbs of the tubular member, said orifices forming between themselves a bridge which extends between the limbs of the tubular member, and on which there is provided at least one conductive track on which said stud-like member bears.

2. A device as claimed in claim 1, characterized in that the tubular member is made of an insulating material, the case being at least one of metallic and metallized.

3. A device as claimed in claim 1, characterized in that a means for retaining the printed circuit is connected to the tubular member.

4. A device as claimed in claim 1, in which the case comprises a wall which is situated in a prolongation of said bridge, characterized in that said wall is pierced by a duct for passage of the electric connection cable and by a threaded hole which opens into said duct and in which a screw is screwed in order to clamp the cable, the case being made of metal or being metallized after the formation of the duct.

5. A device as claimed in claim 1, for which said tubular member is formed by molding, characterized in that it comprises a plurality of said tubular members which are formed as a plurality of members interconnected by an element moulded simultaneously with the members, the members thus being retained relative to one another in positions corresponding to their positions on the printed circuit.

* * * * *